(12) United States Patent
Ogata et al.

(10) Patent No.: US 7,887,313 B2
(45) Date of Patent: Feb. 15, 2011

(54) MOLD APPARATUS FOR RESIN ENCAPSULATION AND RESIN ENCAPSULATION METHOD

(75) Inventors: Kenji Ogata, Ogori (JP); Masashi Nishiguchi, Ogori (JP); Kenichiro Imamura, Ogori (JP)

(73) Assignee: Dai-Ichi Seiko Co., Ltd., Kyoto-shi (JP)

( * ) Notice: Subject to any disclaimer, the term of this patent is extended or adjusted under 35 U.S.C. 154(b) by 0 days.

(21) Appl. No.: 12/094,010

(22) PCT Filed: Nov. 24, 2006

(86) PCT No.: PCT/JP2006/323446

§ 371 (c)(1),
(2), (4) Date: May 16, 2008

(87) PCT Pub. No.: WO2007/061048

PCT Pub. Date: May 31, 2007

(65) Prior Publication Data

US 2008/0308969 A1    Dec. 18, 2008

(30) Foreign Application Priority Data

Nov. 25, 2005    (JP) .............................. 2005-340760

(51) Int. Cl.
*B29C 45/14* (2006.01)
(52) U.S. Cl. .................. 425/116; 425/114; 425/121; 425/125; 425/544; 425/588; 425/149; 425/163
(58) Field of Classification Search ............... 425/116, 425/114, 121, 125, 149, 163, 544, 588
See application file for complete search history.

(56) References Cited

U.S. PATENT DOCUMENTS 5,204,122 A  *  4/1993  Konishi .................... 425/116

(Continued)

FOREIGN PATENT DOCUMENTS

JP          6-71686 A       3/1994

(Continued)

OTHER PUBLICATIONS

Chinese Patent Office communication dated Jan. 8, 2010, for the corresponding Chinese Patent Application No. 200680051808.6 (with English translation).

(Continued)

*Primary Examiner*—Khanh Nguyen
*Assistant Examiner*—Keith T Aziz
(74) *Attorney, Agent, or Firm*—Birch, Stewart, Kolasch & Birch, LLP.

(57) ABSTRACT

To provide a mold apparatus for resin encapsulation, which is small in number of components, has a simple driving mechanism, is easy in assembly or disassembly work, requires no labor for maintenance and has good workability; and a resin encapsulation method. Therefore, of a lower cavity bar 51 and an upper cavity bar 26, a plurality of groove-shaped pots 52 are provided in parallel at a predetermined pitch in a region where a substrate board is disposed, and each groove-shaped pot 52 is individually provided with a plurality of cavities 54 in parallel through runners. Then, a plunger plate 60 inserted in the grooved-shaped pot 52 in a manner so as to be able to move up and down is driven by a plunger 76, whereby a resin for encapsulation inserted into the pot 52 is melted with the plunger plate 60, and the melted resin is filled in the cavities 54 through the runners.

7 Claims, 12 Drawing Sheets

U.S. PATENT DOCUMENTS

| | | | | |
|---|---|---|---|---|
| 5,435,953 A | * | 7/1995 | Osada et al. | 264/102 |
| 5,834,035 A | * | 11/1998 | Osada et al. | 425/116 |
| 5,955,115 A | | 9/1999 | Bolanos et al. | |
| 5,987,737 A | | 11/1999 | Mieda et al. | |
| 2002/0180106 A1 | * | 12/2002 | Ogata et al. | 264/272.11 |
| 2006/0194372 A1 | * | 8/2006 | Tsuchida | 438/124 |

FOREIGN PATENT DOCUMENTS

| | | |
|---|---|---|
| JP | 6-310554 A | 11/1994 |
| JP | 8-340015 A | 12/1996 |
| JP | 9-36156 A | 2/1997 |
| JP | 2000-183084 A | 6/2000 |
| JP | 2001-127091 A | 5/2001 |
| JP | 2001-170782 A | 7/2001 |
| JP | 3604878 B2 | 12/2004 |

OTHER PUBLICATIONS

Korean Office Action issued in Korean patent application No. 2008-7012081 on Feb. 22, 2010. (Provided with English translation.).

Chinese Office Action issued in Chinese Patent Application No. 200680051808.6 on Jul. 6, 2010 with English translation.

* cited by examiner

MOLD APPARATUS FOR RESIN ENCAPSULATION AND RESIN ENCAPSULATION METHOD

TECHNICAL FIELD

The present invention relates to a mold apparatus for resin encapsulation and a resin encapsulation method, and in particular, to a mold apparatus for resin encapsulation and a resin encapsulation method, which reduce unnecessary resin so that resin can be saved.

BACKGROUND ART

Heretofore, as a mold apparatus for resin encapsulation that reduces unnecessary resin, there has been a resin-package manufacturing device provided with a mold having a cavity-forming portion, wherein a lead frame on which electronic components are mounted is positioned, and a plurality of cavities, into which a molten thermosetting resin is filled at positions corresponding to the electronic components, are aligned in a line. The package manufacturing device includes a plurality of runners communicating with the cavities and a plurality of plungers, each of which moves in a reciprocating manner in each runner and extruding a corresponding shaped thermosetting resin chip provided in the runner to cavities after melting the thermosetting resin chip (see Patent Document 1).

Patent Document 1: JP3604878

DISCLOSURE OF INVENTION

Problem to be Solved by the Invention

However, in the resin-package manufacturing device, the plurality of plungers individually incorporated into the plurality of runners are driven so that the thermosetting resin chips are melted. Thus, the number of components is large. Further, as shown in FIG. 6, a conventional example merely discloses that the plungers 37 are moved in a reciprocating manner through coupling bodies 38 and a coupling metal fitting 39. Therefore, in the resin-package manufacturing device, its driving mechanism is complicated, it is not easy to assemble or disassemble components, so that a lot of labor is required for maintenance. In particular, if the kind of article to be resin encapsulated is different, it takes a lot of labor to change molds, and thus there is a problem of poor workability.

In view of the above problem, an object of the present invention is to provide a mold apparatus for resin encapsulation, which is small in number of components, has a simple driving mechanism, is easy in assembly or disassembly work, requires no labor for maintenance and has good workability; and a resin encapsulation method.

Means of Solving the Problem

In order to solve the above problem, in a mold apparatus for resin encapsulation according to the present invention, a peripheral edge portion of a substrate board, on which electric components are mounted, is clamped by both an upper mold disposed in a lower surface of an upper mold set and a lower mold disposed in an upper surface of a lower mold set, cavities are formed, a resin for encapsulation, which is inserted into pots provided in any one of the mold sets, is fluidified through plungers, and the melted resin is filled in the cavities, whereby the electric components mounted on a surface of the substrate board are encapsulated with the resin, a plurality of thin groove-shaped pots are provided in parallel at a predetermined pitch in a region, where the substrate board is disposed, of one of opposite surfaces of the lower mold and the upper mold, each thin groove-shaped pot is individually provided with a plurality of cavities in parallel through runners, a plunger plate inserted into the thin groove-shaped pot so as to be able to move up and down is driven by each plunger, the resin for encapsulation inserted into the pot is melted with the plunger plate, and the melted resin is filled in the cavities through the runners.

Effect of the Invention

According to the present invention, since the plunger plate inserted into the thin groove-shaped pot is driven by the plunger, the number of components is reduced and the driving mechanism becomes simple.

In an embodiment of the present invention, the plunger plate has a T-shaped front face with its one end portion having a wide portion.

According to the present embodiment, a slide contact area is reduced and friction resistance is reduced. Therefore, it is possible to drive the plunger plate smoothly.

In another embodiment of the present invention, a thin groove into which a melted resin can penetrate is provided along a width direction in at least one surface of the wide portion of the plunger plate.

According to the present embodiment, through the resin penetrated into the thin groove, it is possible to prevent penetration of another resin, and also the resin penetrated into the thin groove functions as a lubricant material. Therefore, it is possible to secure a smooth reciprocating movement of the plunger plate.

In an embodiment of the present invention, the mold and a chase provided with the plunger plates are slid sideways so as to be attachable to and detachable from the mold set.

According to the present embodiment, the chase is pressed sideways or drawn out, whereby assembly or exchange work can be performed simply and promptly. Therefore, maintenance is facilitated.

In an embodiment of the present invention, an engagement portion provided at one end portion of the plunger having a circular shape in cross section is engaged in a sliding manner with an engagement receiving portion provided at one end edge portion of the plunger plate.

According to the present embodiment, since the engagement portion having the circular shape in cross section of the plunger can be engaged in a sliding manner with the engagement receiving portion of the plunger plate, assembly work can be performed simply, and workability is improved more.

In an embodiment of the present invention, thin grooves, each of which has the same planar shape as that of an opening of the pot, are provided in positions, which corresponding to the pots, of the substrate board to be positioned to the mold.

According to the present embodiment, it is possible to bring the resin into press contact with the opposite surface of the mold through the thin grooves provided in the substrate board. Therefore, it is possible to promptly melt the resin.

In an embodiment of the present invention, a resin for encapsulation may be the bar-shaped material having the same planar shape as that of an opening of the pot, alternatively, it may have a block shape, which is obtained by dividing a bar-shaped material having the same planar shape as that of an opening of the pot into a plurality of pieces.

According to the former of the present embodiment, all that is required is to insert the bar-shaped resin into the pot and therefore work efficiency is high. Further, according to the latter, it is possible to select the number of pieces of the block-shaped resin and therefore, it is convenient.

In order to solve the above problem, in a resin encapsulation method according to the present invention, a peripheral edge portion of a substrate board, on which electric components are mounted, is clamped by both an upper mold disposed in a lower surface of an upper mold set and a lower mold disposed in an upper surface of a lower mold set, cavities are formed, a resin for encapsulation, which is inserted into pots provided in any one of the mold sets, is fluidified through plungers, and the melted resin is filled in the cavities, whereby the electric components mounted on a surface of the substrate board are encapsulated with the resin. Said method comprises the steps of:

providing in parallel a plurality of thin groove-shaped pots at a predetermined pitch in a region, where the substrate board is disposed, of one of opposite surfaces of the lower mold and the upper mold;

providing individually each thin groove-shaped pot with a plurality of cavities in parallel through runners;

driving a plunger plate inserted into the thin groove-shaped pot so as to be able to move up and down by each plunger;

melting the resin for encapsulation, which has been inserted into the pot, with the plunger plate; and filling the melted resin in the cavities through the runners.

According to the present invention, since the plunger plate inserted into the thin groove-shaped pot is driven by the plunger, the number of components is reduced and the structure is simple. Accordingly, transmission loss of power is small, and there is an effect that the resin encapsulation method that enables a quick operation is obtained.

BRIEF DESCRIPTION OF DRAWINGS

FIG. 8E and FIG. 5F are a plan view and a side view of the substrate board showing that the electronic components mounted on the substrate board are resin encapsulated;

DESCRIPTION OF NUMERALS

Figure 1:
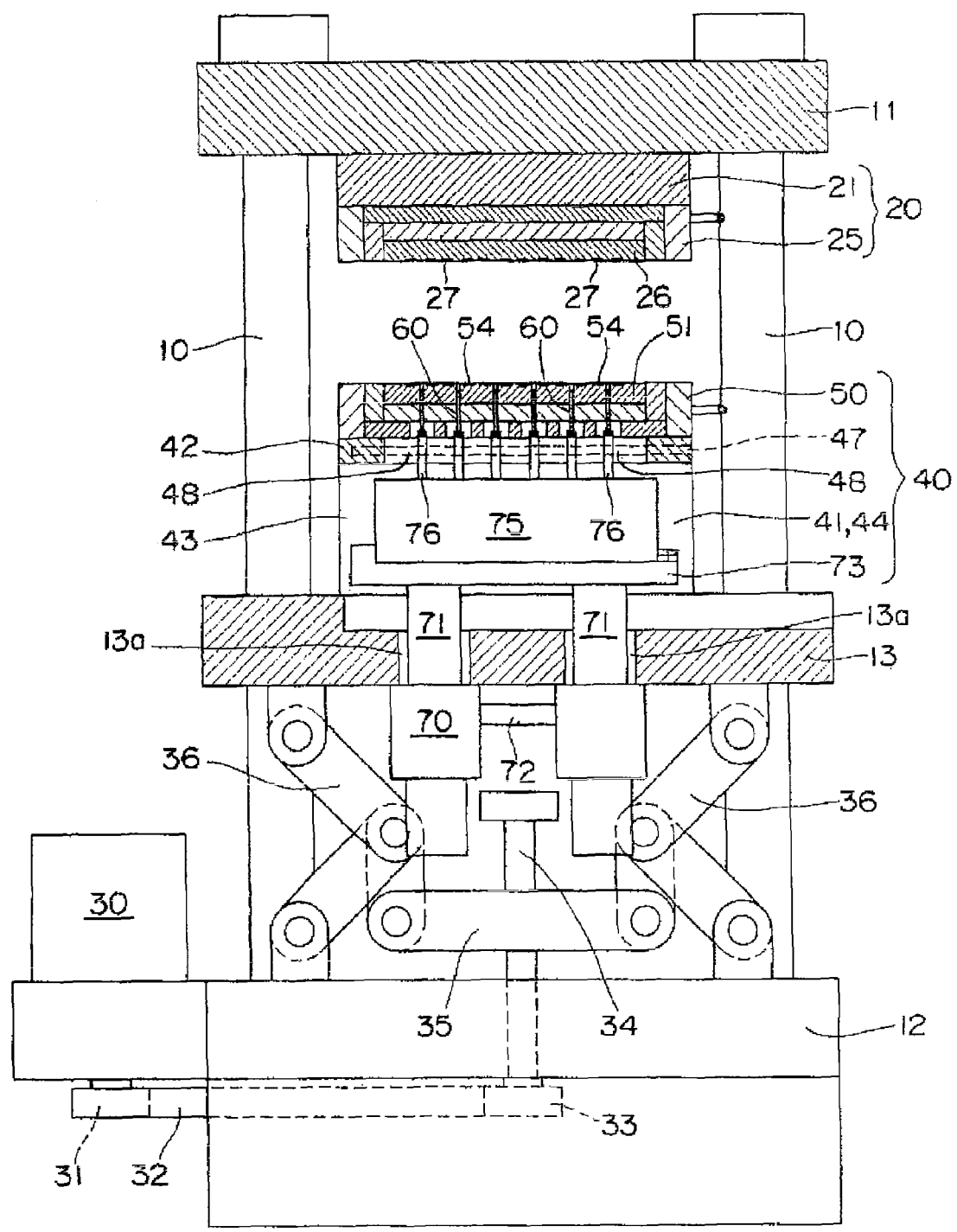
FIG. 1 is an elevational view of a mold apparatus for resin encapsulation according to the present invention.

10: tie bar
11: upper fixed platen
12: lower fixed platen
13: movable platen
20: upper mold set
21: upper mold base
22 guide groove
23: heater
25: upper mold chase
26: upper cavity bar
27: upper cavity
30: servo motor
31, 33: first pulley, second pulley
32: timing belt
34: precision ball screw
35: nut
40: lower mold set
41: lower mold base
42: mold plate
43: support block
44: internal space
45: side bar
46: guide groove
47: heater
48: through groove
50: lower mold chase
51: lower cavity bar
52: thin groove-shaped pot
53: runner
54: lower cavity
60: plunger plate
61: wide portion
62: thin groove
63: engagement receiving portion
70: elevating device
71: elevating shaft
72: transmission shaft
73: transfer plate
74: guide projection
75: equi-pressure device
80: substrate board
81: thin groove
83: electronic component
84: molded article
85: unnecessary resin
90, 91: bar-shaped resin, block-shaped resin

BEST MODE FOR CARRYING OUT THE INVENTION

An embodiment of the present invention will be described according to the accompanying drawings of FIG. 1 through FIG. 12.

Figure 3A:
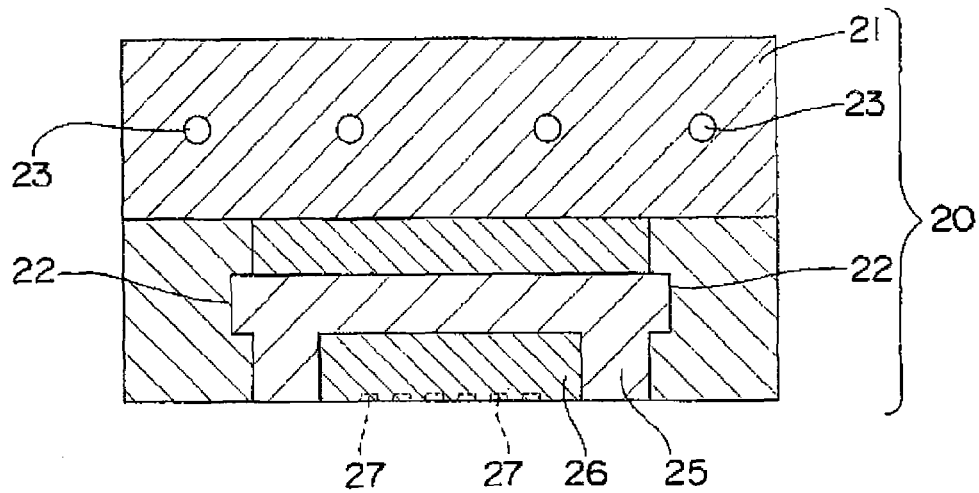
FIG. 3A and FIG. 3B are longitudinal cross sectional views of an upper mold set and the lower mold set shown in FIG. 1.
Figure 3B:
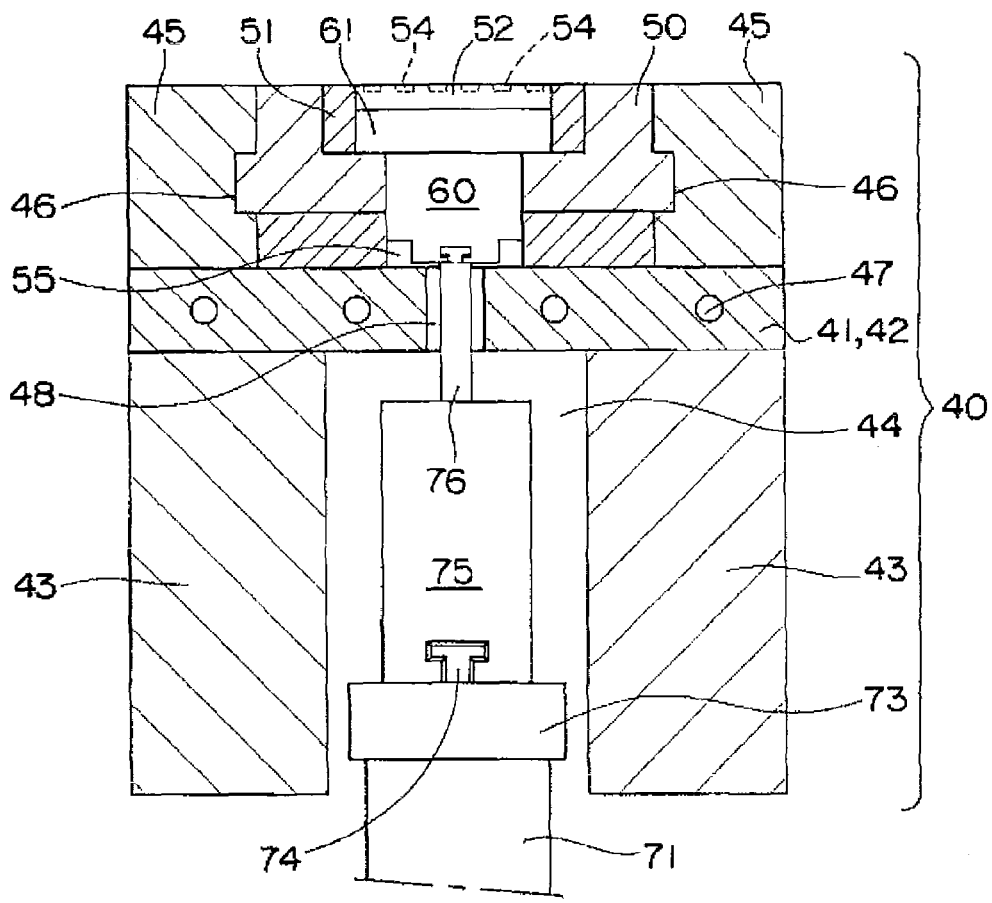

As shown in FIG. 1, in a mold apparatus for resin encapsulation of the present embodiment, an upper fixed platen 11 and a lower fixed platen 12 are connected to each other through four tie bars 10 (support columns), and a movable platen 13 is disposed between them so as to be able to move up and down As shown in FIG. 1, an upper mold set 20 is fixed to a lower surface of the upper fixed platen 11. As shown in FIG. 3, the upper mold set 20 is constructed of an upper mold base 21 roughly having a C-shape in cross section and an upper mold chase 25 fitted in a sliding manner so as to be attachable and detachable through guide grooves 22, 22 provided in opposite inside surfaces of the upper mold base 21. Heaters 23 are incorporated in the upper mold base 21. Further, an upper cavity bar 26 is disposed at a central portion of a lower surface of the upper mold chase 25. Upper cavities 27 are provided in a lower surface of the upper cavity bar 26 at a predetermined pitch so as to correspond to lower cavities 54 of a lower cavity bar 51 described below.

In addition, the upper cavity bar 26 may be provided with runners communicating with pots 52 of the lower cavity bar 51 described below if necessary. Further, in the case where only electronic components disposed on a lower surface of a substrate board 80 are molded by resin encapsulation, which will be described below, the upper cavities 27 are not required.

As shown in FIG. 1, a servo motor 30 is attached to the lower fixed platen 12. By rotating the servo motor 30, power is transmitted to a precision ball screw 34 through a first pulley 31, a timing belt 32 and a second pulley 33. Thus, a nut 35 that is screwed to the precision ball screw 34 converts a rotational movement into a linear movement. As a result of this, the movable platen 13 makes an up and down reciprocating movement through a toggle mechanism 36 disposed between the lower fixed platen 12 and the movable platen 13. In the present embodiment, since a driving force is transmitted to the servo motor 30, the timing belt 32 and the precision ball screw 34, it is possible to perform accurate position control and possible to accurately perform clamping.

Figure 2A:
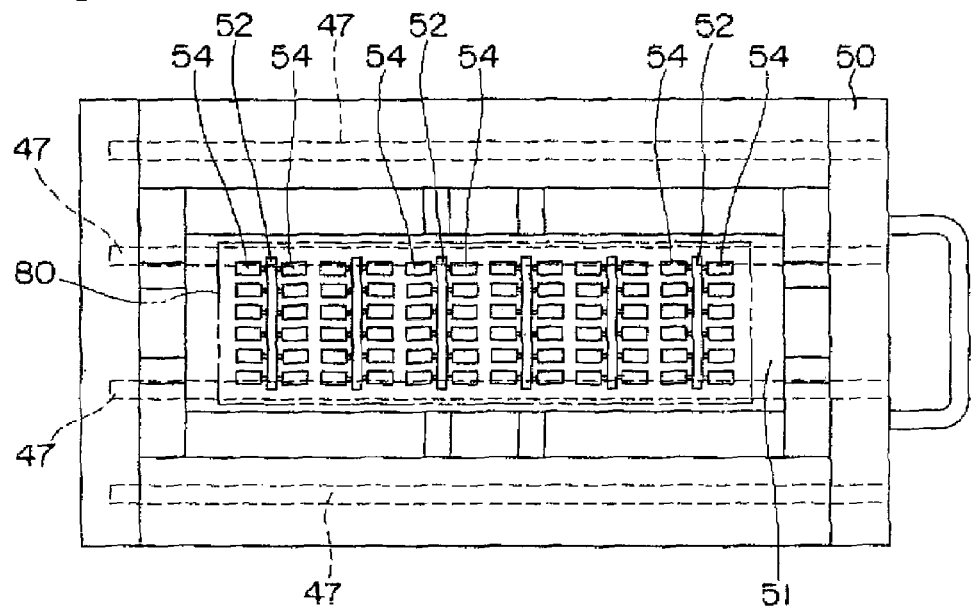
FIG. 2A and FIG. 2B are a plan view and a cross sectional view of a lower mold set shown in FIG. 1.
Figure 2B:
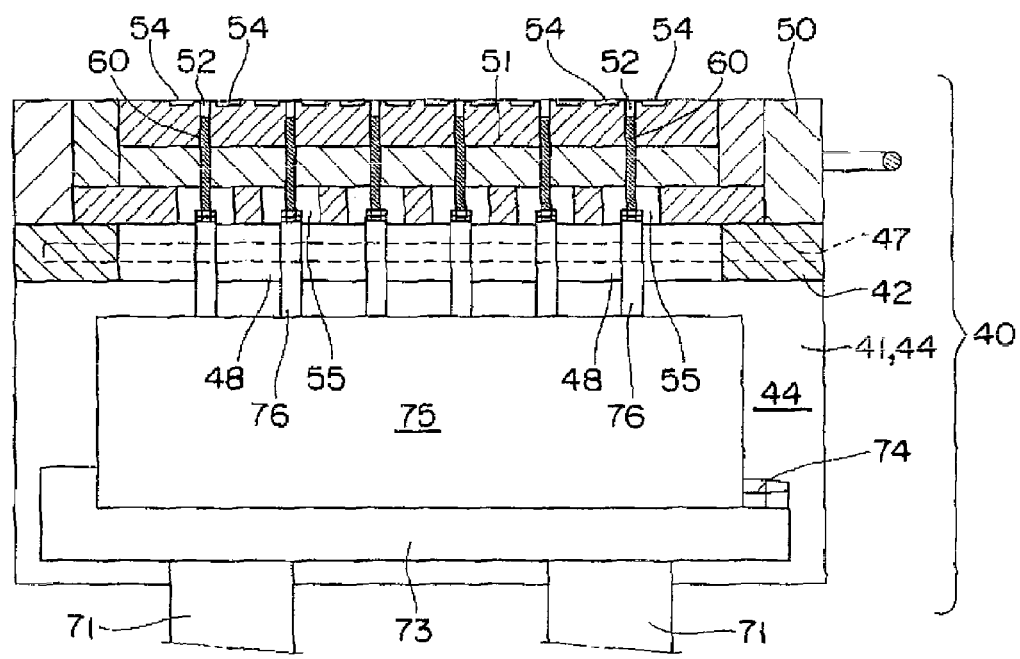
Figure 4A:
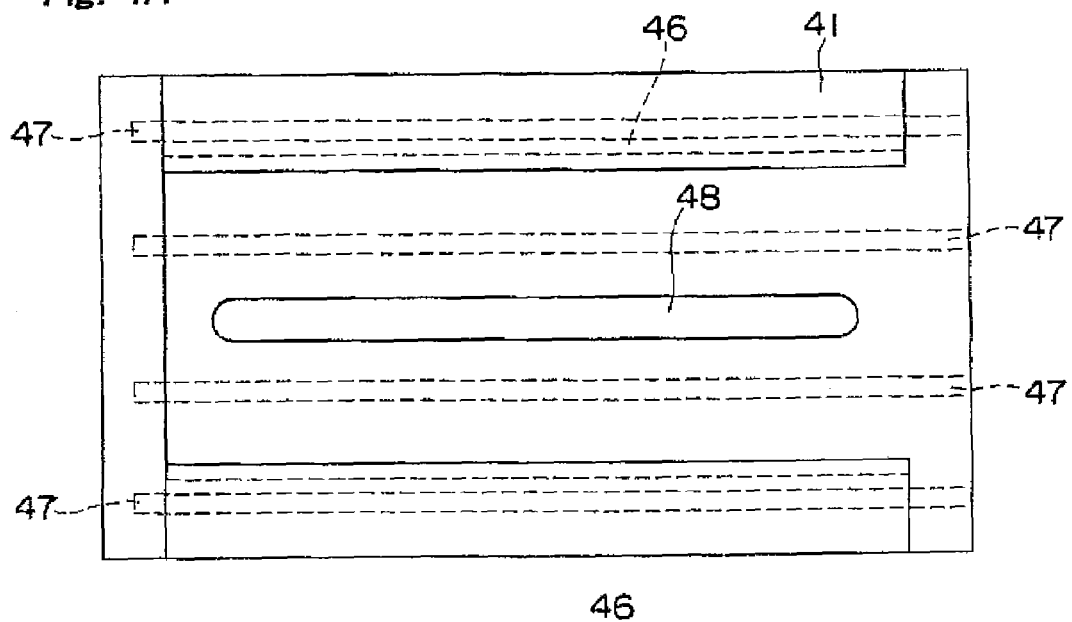
FIG. 4A and FIG. 4B are a plan view and a longitudinal cross sectional view of a lower mold base shown in FIG. 1.
Figure 4B:
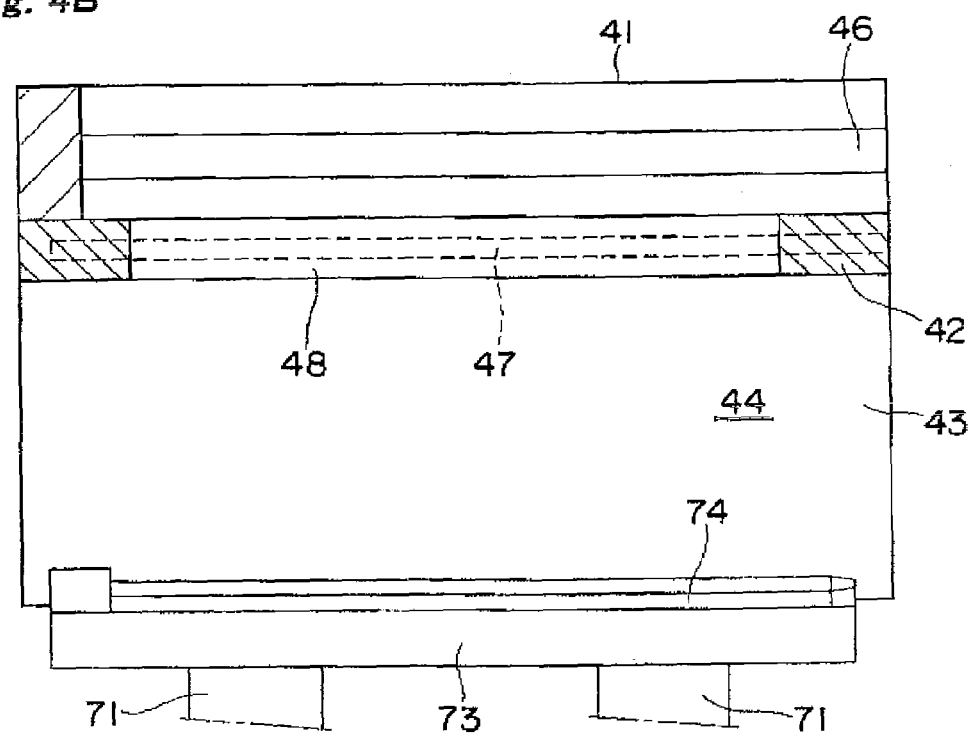

A lower mold set 40 is mounted on an upper surface of the movable platen 13, and an elevating device 70 is disposed on a lower surface of the movable platen 13. As shown in FIG. 2 and FIG. 3, the lower mold set 40 is constructed of a lower mold base 41 and a lower mold chase 50. As shown in FIG. 4, the lower mold base 41 is formed with an internal space 44 by disposing support blocks 43 on both side edge portions of a lower surface of a mold plate 42, while a pair of side bars 45, 45 are provided on both side edge portions of an upper surface of the mold plate 42. Guide grooves 46 for fitting the lower mold chase 50 in a sliding manner are respectively formed in opposite inside surfaces of the side bars 45. Heaters 47 are incorporated in the mold plate 42, and a through groove 48 is provided therein.

Figure 12A:
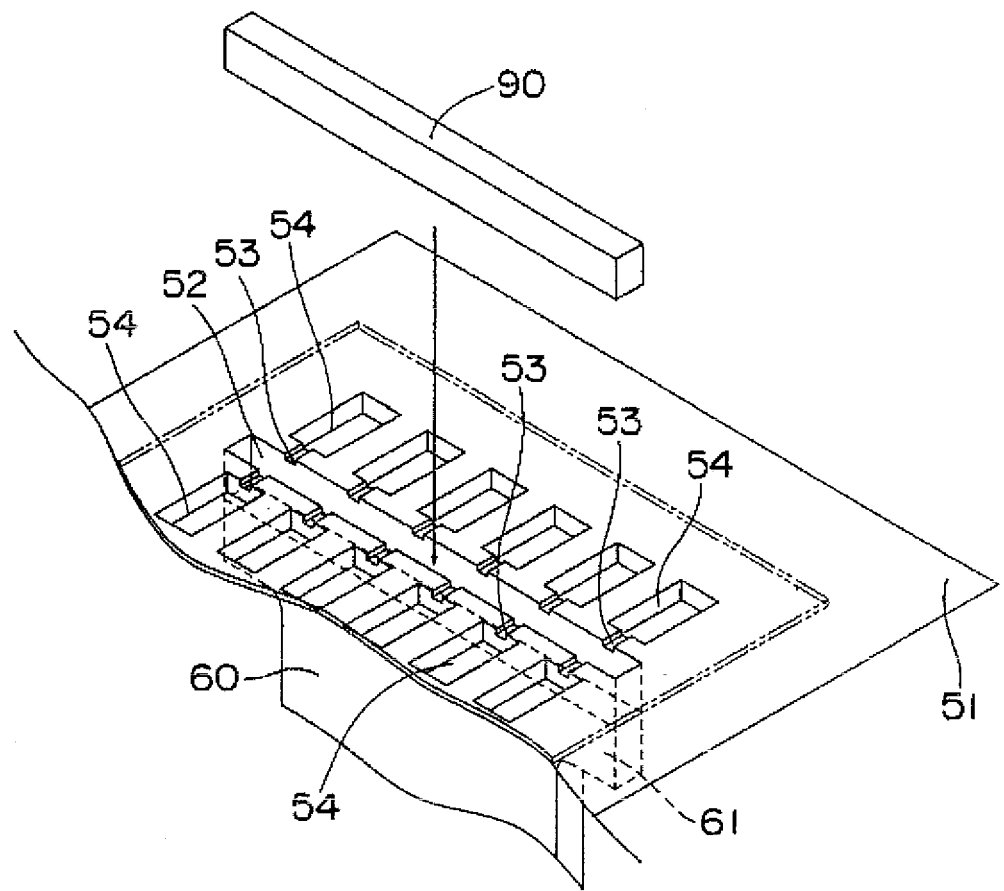
FIG. 12A and FIG. 12B are perspective views for showing a method of inserting resins with different shapes into the lower mold chase.
Figure 12B:
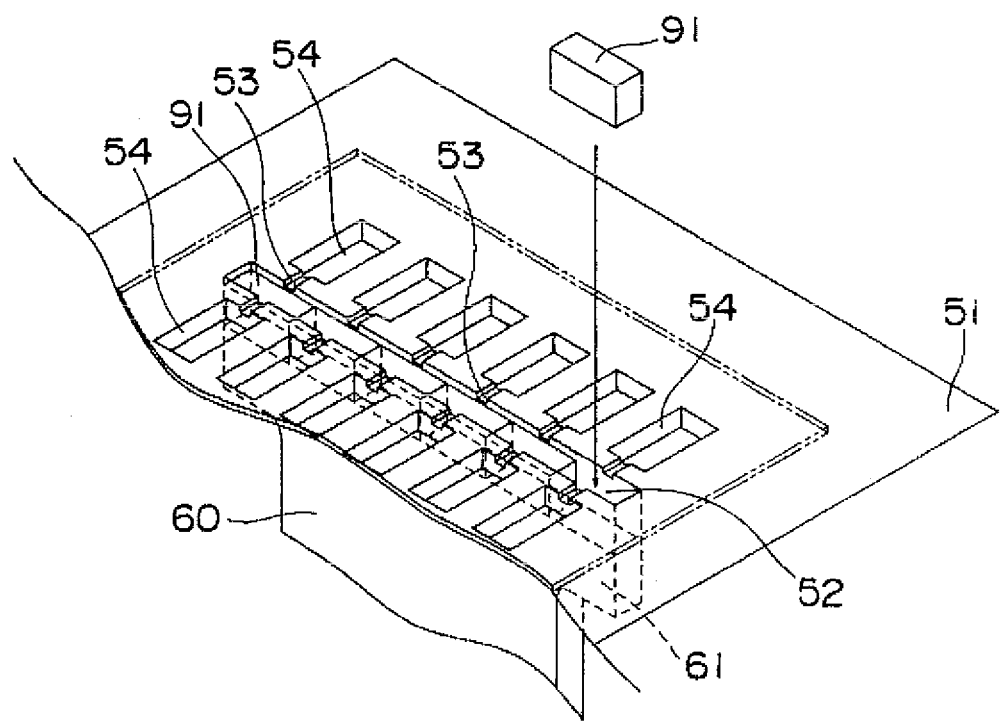

The lower cavity bar 51 is disposed at a central portion of an upper surface of the lower mold chase 50. Long groove-shaped pots 52 penetrating up and down are arranged in parallel at an equal pitch in the lower cavity bar 51 as shown in FIGS. 12A and 12B. Further, on both sides of each pot 52, cavities 54 communicating therewith through runners 53 are respectively provided. A front face of the pot 52 roughly has a T-shape in order to prevent a plunger plate 60 having a T-shaped front face from falling off. Further, a lower opening of the pot 52 communicates with the through groove 48 of the mold plate 42 through a fitting recess 55 formed in a bottom surface of the lower mold chase 50. A bar-shaped resin 90 or a plurality of block-shaped resins 91 can be inserted into the pot 52. The lower mold chase 50 is fitted in a sliding manner into the guide grooves 46 of the side bars 45 provided on both the side edge portions of the upper surface of the mold plate 42, so that the lower mold chase 50 is prevented from falling off in a state in which it is detachable and attachable.

Figure 6A:
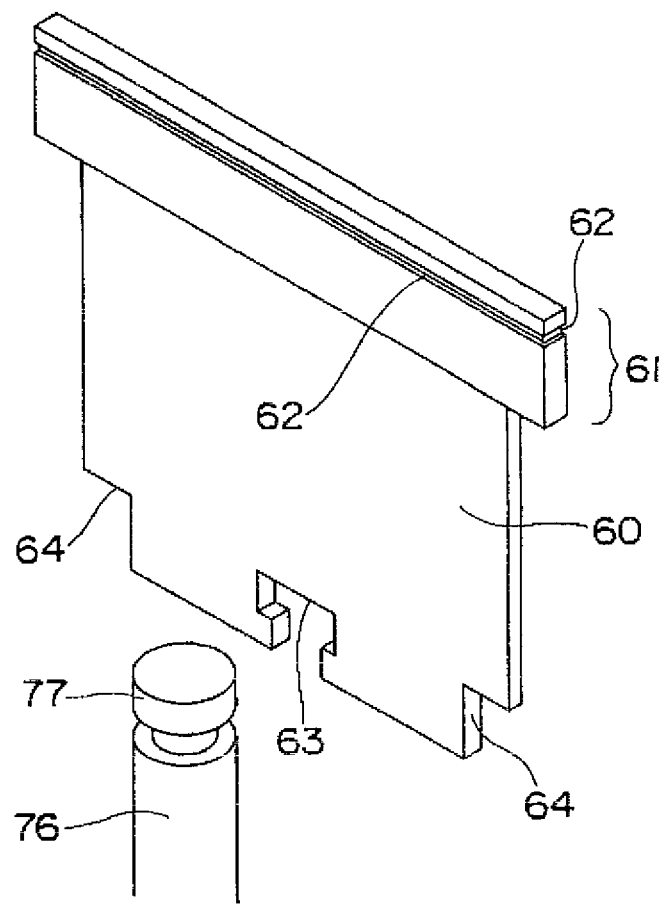
FIG. 6A and FIG. 6B are perspective views for describing a method of engaging a plunger plate and a plunger.
Figure 6B:
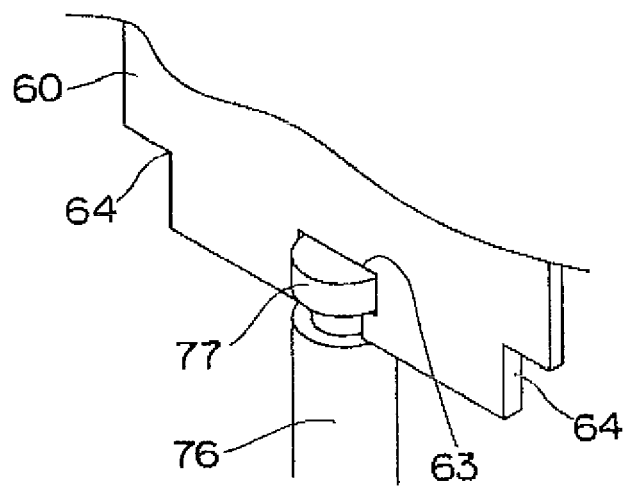
Figure 6C:
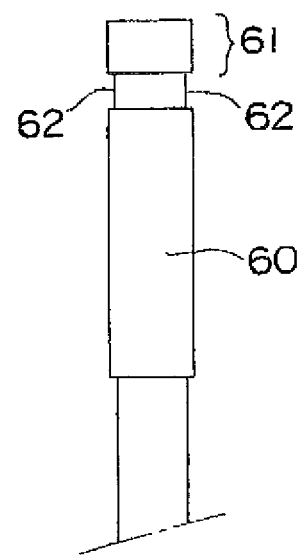
FIG. 6C is a side view showing an upper portion of the plunger plate.

As shown in FIG. 6, the plunger plate 60 is a metal plate having a roughly T-shaped front, which can slide up and down within the pot 52. A wide portion 61 provided at its upper side has a larger plate thickness than that of the other portions so as to make it slide easily, and highly precise surface finishing is done. Further, a pair of thin grooves 62 are provided in front and back surfaces of the wide portion 61. A resin for encapsulation that has penetrated into the grooves 62 functions as a sealing material for preventing penetration of a resin as well as a lubricant material for securing a smooth sliding operation. Furthermore, the plunger plate 60 is formed with a roughly T-shaped engagement receiving portion 63 at the center of its lower side edge portion, and notches 64 are formed on both side edge portions of the lower side.

As shown in FIG. 1, the elevating device 70 is configured so that elevating shafts 71 are respectively inserted through a plurality of through holes 13a provided in the movable platen 13, and the servo motor not shown is driven, whereby the elevating shafts 71 are made to slide up and down through a transmission shaft 72, so that a transfer plate 73 is moved up and down. Then, an equi-pressure device 75 is fitted in a sliding manner and fixed to a projection 74 having a roughly T-shape in cross section, which is protrusively provided at the center of an upper surface of the transfer plate 73. Therefore, the equi-pressure device 75 can be moved up and down within the internal space 44 of the lower mold base 41 through the elevating device 70.

In the equi-pressure device 7S, plungers 76 are provided in parallel at a predetermined pitch in a position corresponding to the through groove 48 of the mold plate 42. Each plunger 76 is supported by an oil hydraulic pressure or a spring force in the equi-pressure device 75 so that the plungers 76 can slide up and down individually. An engagement portion 77 for engagement with the plunger plate 60, which will be described below, is formed at an upper end portion of the plunger 76.

Examples of the substrate board 80 clamped by the upper mold chase 25 and the lower mold chase 50 and encapsulated include those each having thin grooves 81 formed therein at a predetermined pitch and lands 82 provided on both sides of each thin groove 81 for disposing electronic components 83 as shown in FIG. 8 and FIG. 9, for example. An electronic component 83 placed on each land 82 is electrically connected by a bonding wire. Then, a resin encapsulated molded article 84 is obtained. The electronic components 83 may be disposed not only on one side, but on both sides of the substrate board.

Next, a method of assembling the lower mold chase 50 to the lower mold base 41 according to the present embodiment will be described.

Figure 5A:
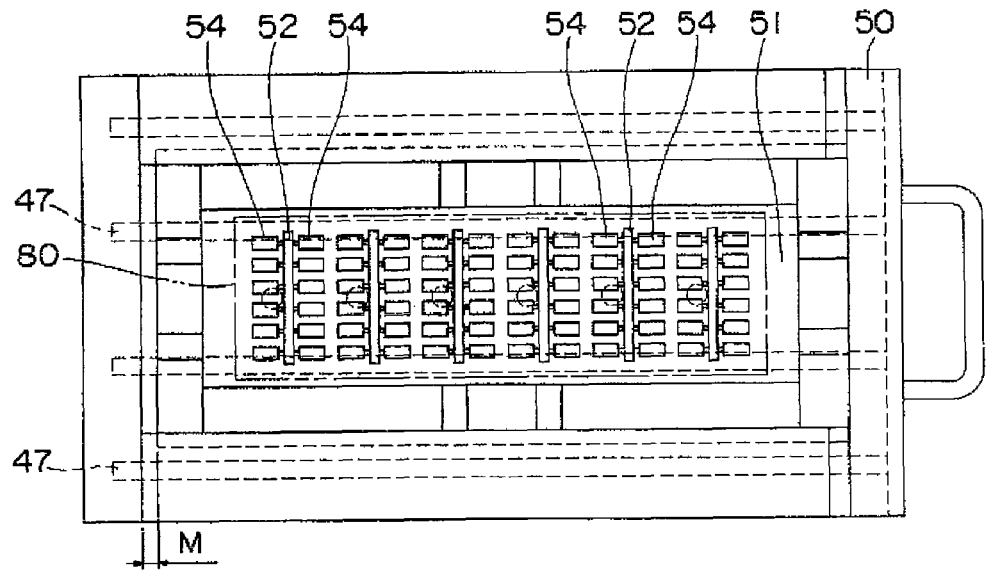
FIG. 5A and FIG. 5B are a plan view and a longitudinal cross sectional view for describing a method of assembling a lower mold chase shown in FIG. 1.
Figure 5B:
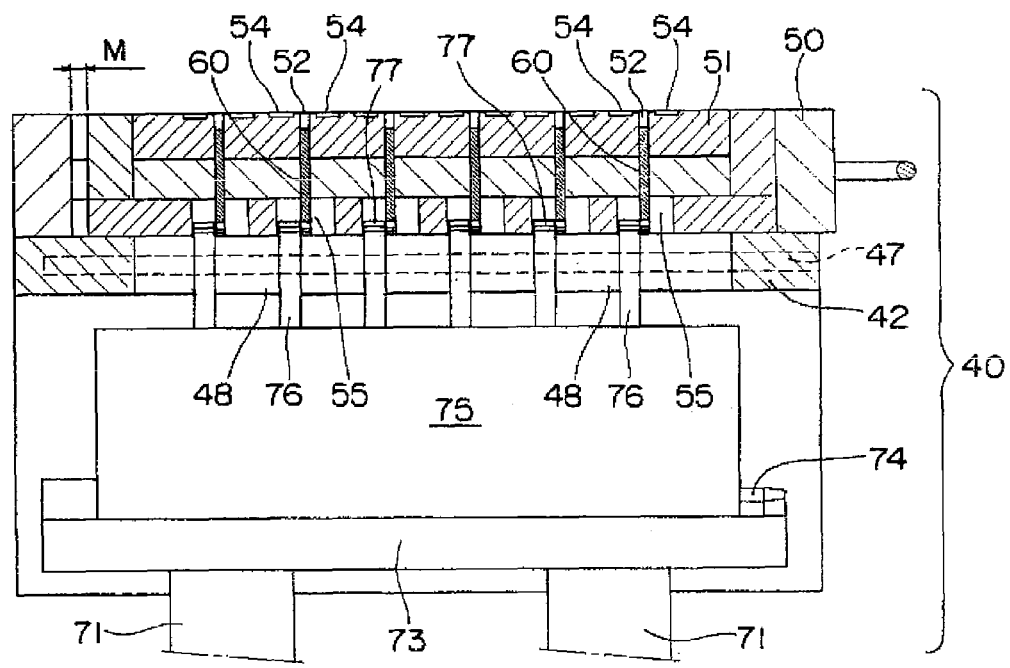

That is, as shown in FIG. 5, the lower mold chase 50 with the plunger plates 60 set up is assembled to the lower mold base 41 leaving only a gap M. On the other hand, the elevating device 70 is driven to elevate the transfer plate 73, whereby the engagement portion 77 of the plunger 76 assembled to the equi-pressure device 75 is protruded in the fitting recess 55 of the lower mold chase 50. Then, by pushing the lower mold chase 50 into a final assembling position, the engagement portion 77 of the plunger 76 is engaged with the engagement receiving portion 63 of the plunger plate 60 (FIG. 6B). Thereby, the plunger plate 60 can be moved up and down through the plunger 76.

Figure 7A:
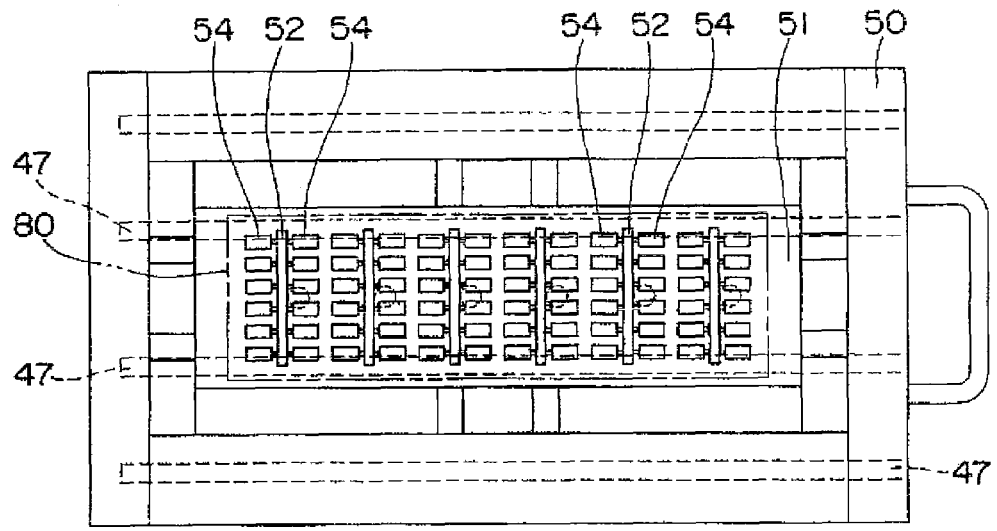
FIG. 7A and FIG. 7B are a plan view and a longitudinal cross sectional view for describing another method of assembling the lower mold chase shown in FIG. 1.
Figure 7B:
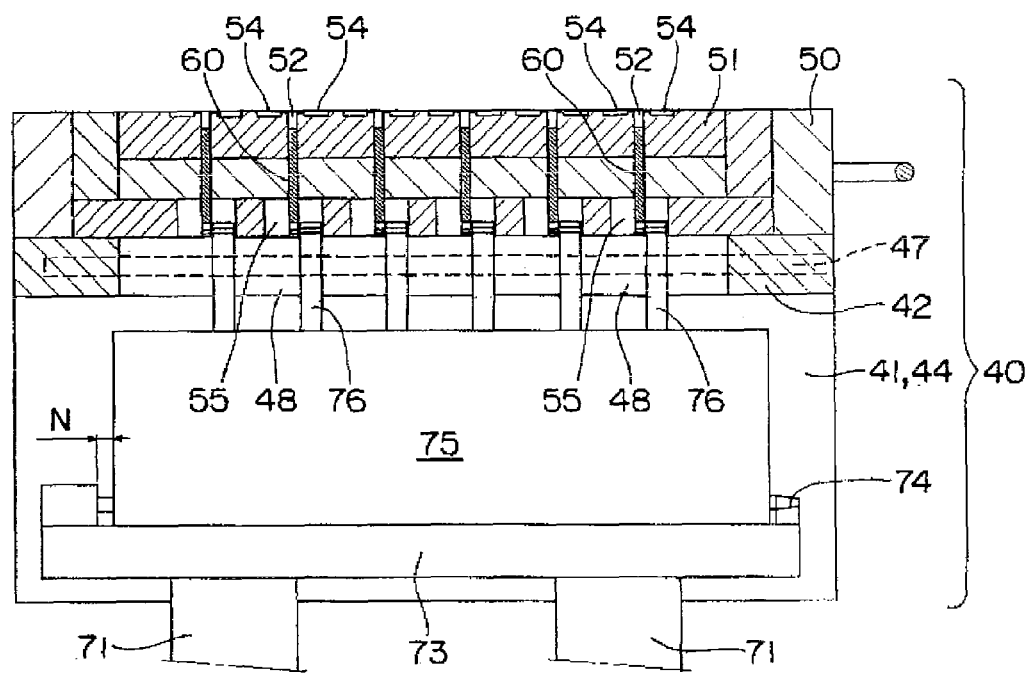
Figure 8A:
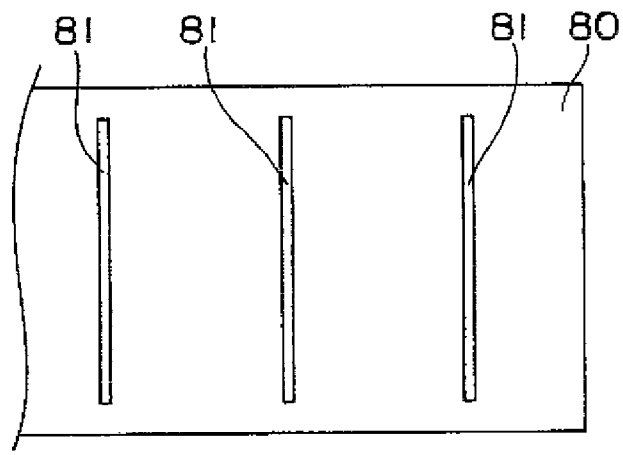
FIG. 8A and FIG. 8B are a plan view and a side view of a substrate board.
Figure 8B:
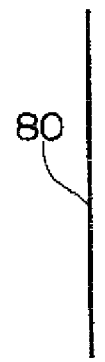
Figure 8C:
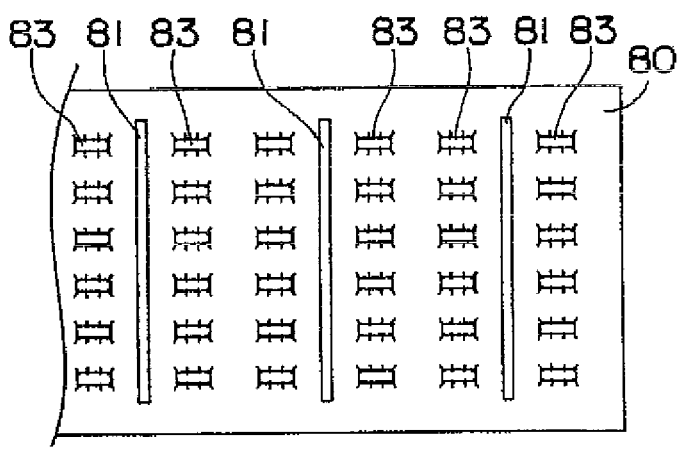
FIG. 8C and FIG. 8D are a plan view and a side view of the substrate board on which electronic components are mounted.
Figure 8D:
Figure 8E:
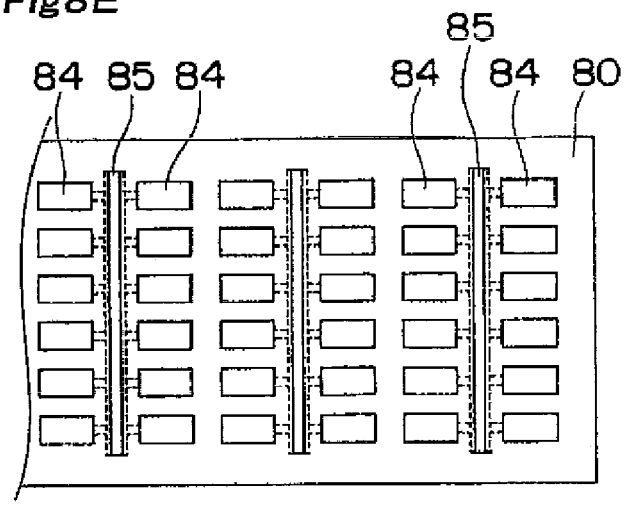
Figure 8F:
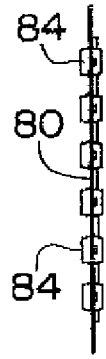
Figure 9A:
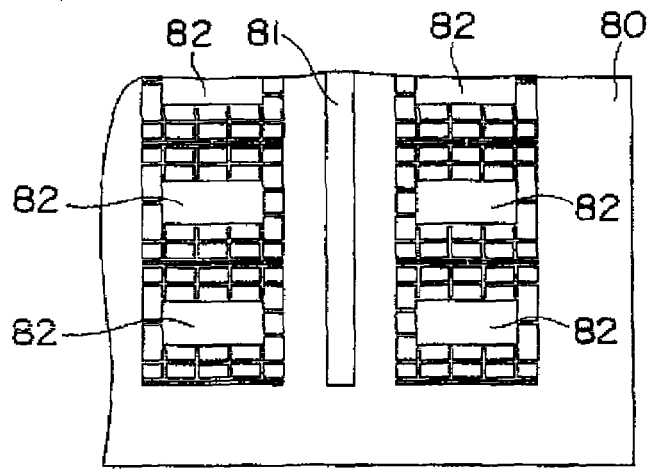
FIG. 9A and FIG. 9B are a partially enlarged plan view and a partially enlarged side view of a substrate board.
Figure 9B:
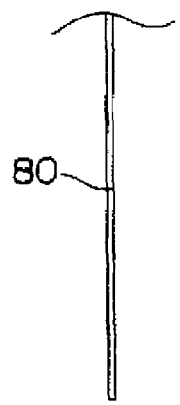
Figure 9C:
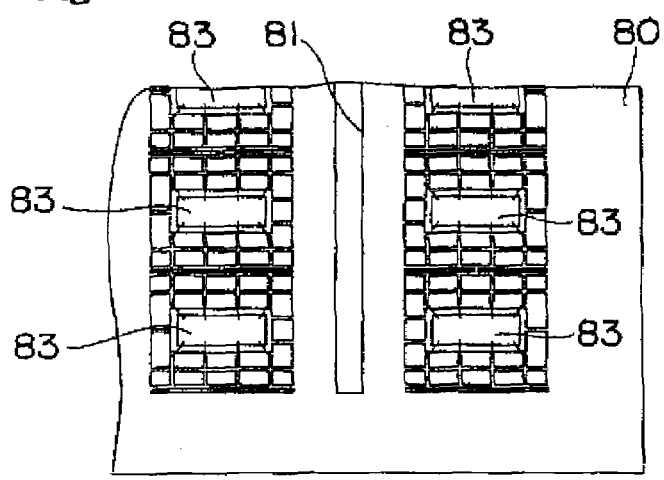
FIG. 9C and FIG. 9D are a partially enlarged plan view and a partially enlarged side view of the substrate board on which electronic components are mounted.
Figure 9D:
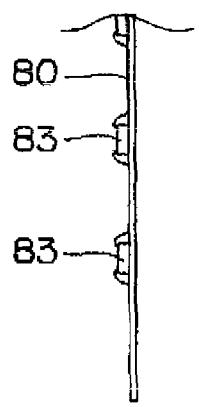
Figure 9E:
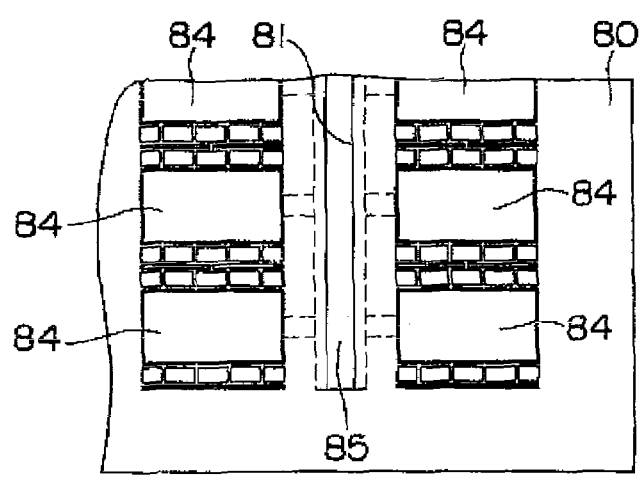
FIG. 9E and FIG. 9F are a partially enlarged plan view and a partially enlarged side view of the substrate board showing that the electronic components mounted on the substrate board are resin encapsulated.
Figure 9F:
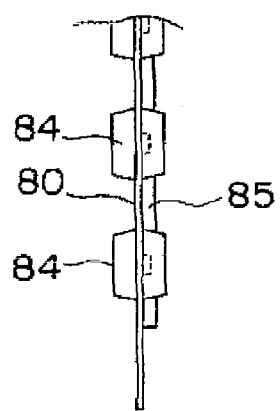

The method of assembling the lower mold chase 50 is not limited to the above-mentioned assembling method, and it may be assembled as shown in FIG. 7.

That is, by sliding the lower mold chase 50 to the final assembling position, it is assembled to the lower mold base 41. On the other hand, the equi-pressure device 75 is fitted to the transfer plate 73 in a sliding manner with only a gap N left. Then, the elevating device 70 is driven to elevate the transfer plate 73, so that the engagement portion 77 of the plunger 76 is protruded in the fitting recess 55 of the lower mold chase 50. Then, by pressing the equi-pressure device 75 to a final assembling position, the engagement portion 77 of the plunger 76 is engaged with the engagement receiving portion 63 of the plunger plate 60. Thereby, the assembly work is completed.

As is apparent from the above description, according to the present embodiment, the plunger plate 60 can be attached to and detached from the plunger 76 by merely sliding the lower mold chase 50 along an upper surface of the lower mold base 41. Further, the equi-pressure device 75 can be easily attached to and detached from the transfer plate 73, and the upper mold chase 50 can also be easily attached to and detached from the upper mold base 41. Therefore, assembly or disassembly work is simple and maintenance is easy. Furthermore, the lower mold chase 50, the upper mold chase 25 and the equi-pressure device 75 can be easily exchanged depending on the type of article to be molded. Thus, there is an advantage that a mold apparatus for resin encapsulation with good workability can be obtained.

Next, a method of encapsulating a substrate board 80 with a resin will be described based on the above-mentioned embodiment.

First, after the movable platen 13 is positioned to a material feeding position that is a lower position, a bar-shaped resin 90 (or block-shaped resin 91) is inserted into the pot 52 provided in the lower cavity bar 51 of the lower mold chase 50 (FIGS. 12A, 12B). Then, the substrate board 80 on which electronic components 83 are mounted is positioned above the lower cavity bar 51 of the lower mold chase 50.

In addition, if the block-shaped resin 91 is used, even if the kind of article to be molded is different, it is possible to cope with that only by changing the number in of the block-shaped resins 91. Thus, there is an advantage that it is user-friendly. Further, the resin for encapsulation is not limited to a bar shape or a block shape, and it may also be a granular shape or a powder shape.

Figure 10A:
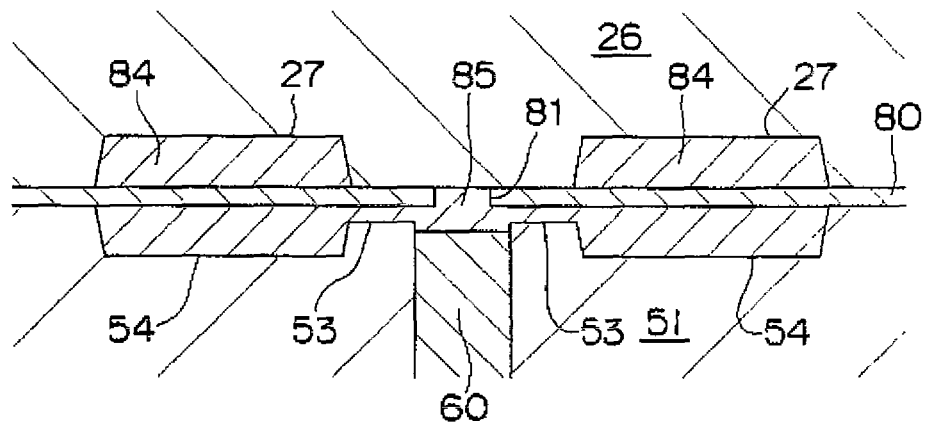
FIG. 10A, FIG. 10B and FIG. 10C are an enlarged cross sectional view, a perspective view and a transparent view, respectively, of the substrate board encapsulated with a resin.
Figure 10B:
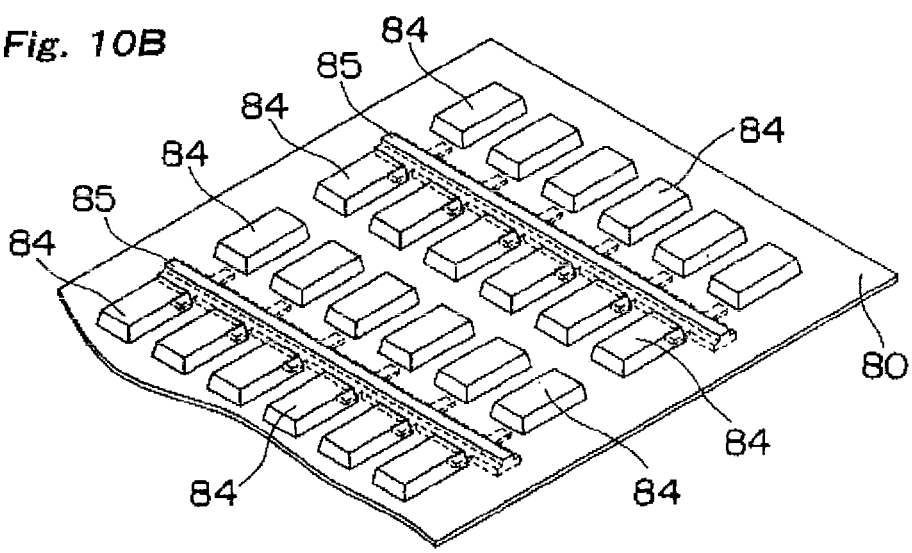
Figure 10C:
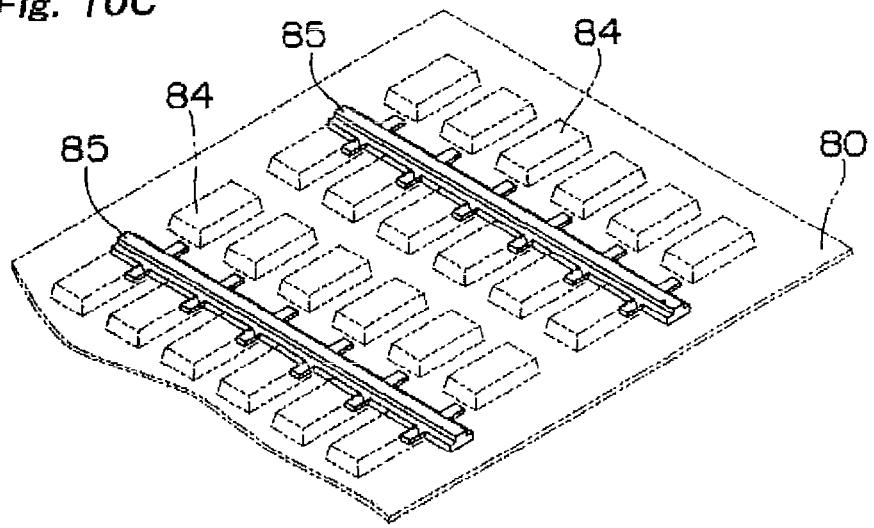

Then, by driving the servo motor 30, the movable platen 13 is raised, and the lower mold chase 25 is joined to the upper mold chase 50. Thereby, the substrate board 80 is clamped by the upper cavity bar 26 and the lower cavity bar 51. Then, by driving the elevating device 70 to raise the transfer plate 73, the plunger 76 is pushed up through the equi-pressure device 75. Therefore, the resin 90 heated in the pot 52 is pressed against the heated upper cavity bar 26 by the plunger plate 60 heated beforehand so as to be melted. As a result of this, after the melted resin flows into the lower cavities 54 through the runners 53, it is penetrated into the upper cavities 27 through gaps of lead portions of the substrate board 80. Thereby, the electronic components 83 mounted on an upper surface of the substrate board 80 are resin encapsulated, so that molded articles 84 with an unnecessary resin 85 are obtained (FIG. 10).

Subsequently, the elevating device 70 is driven again so that the transfer plate 73 is lowered, whereby the unnecessary resin 85 is removed from an upper end of the plunger plate 60. Furthermore, the servo motor 30 is driven again so that movable platen 13 is lowered, whereby the upper cavity bar 26 and the lower cavity bar 51 are separated from each other. By taking the resin encapsulated molded articles 84 out of the lower chase 50, resin encapsulation work is completed. After that, by repeating the same work, the resin encapsulation work can be performed According to the present embodiment, since there are no portions corresponding to culls and runners extended from the culls to the substrate board, which are provided outside the region where the substrate board is disposed in the conventional mold, generation of an unnecessary resin is avoided because of that. Thus, an unnecessary resin can be reduced. In particular, the more the size of the electronic components is reduced, the more the proportion occupied by the culls and the like increases. Thus, the effect of reducing the unnecessary resin is relatively increased. Accordingly, since the amount of the resin to be heated and melted is reduced, it is possible to perform heating of the resin promptly, shorten the heating time, reduce the size of the heating heater and save consumption energy.

Further, in the present embodiment, it is not required to provide the pots outside the region where the substrate board is disposed in the mold. All that is required is to provide the pots in the region where the substrate board is disposed in the mold. Therefore, the base area of the mold can be reduced. In particular, since the groove-shaped pots are provided in the mold, effective utilization of dead space in the mold is facilitated, so that the size of the mold can be reduced more.

Furthermore, the melted resin flows into the cavities disposed on the sides of the pot through the runners, not only each travel distance of the melted resin is short, but also the travel distance of the melted resin is equal in all the runners. Therefore, there is an advantage that it is possible to uniformly fill the resin into the cavities.

Figure 11A:
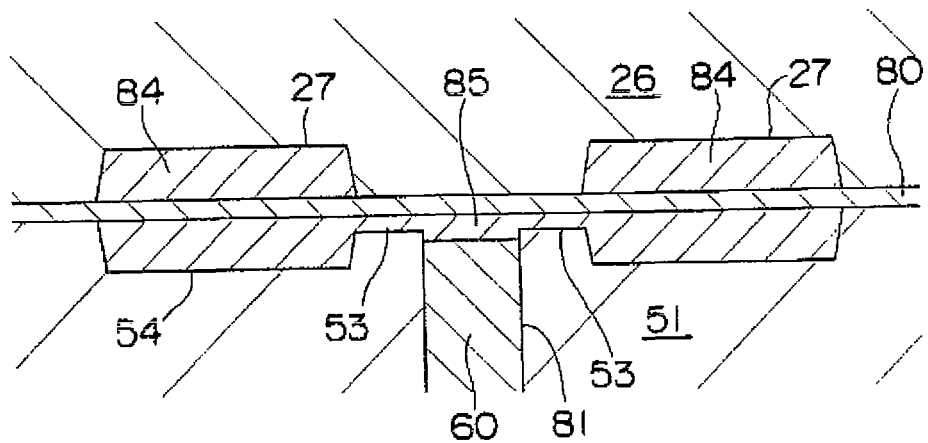
FIG. 11A, FIG. 11B and FIG. 11C are an enlarged cross sectional view, a perspective view and a transparent view, respectively, of another substrate board encapsulated with a resin.
Figure 11B:
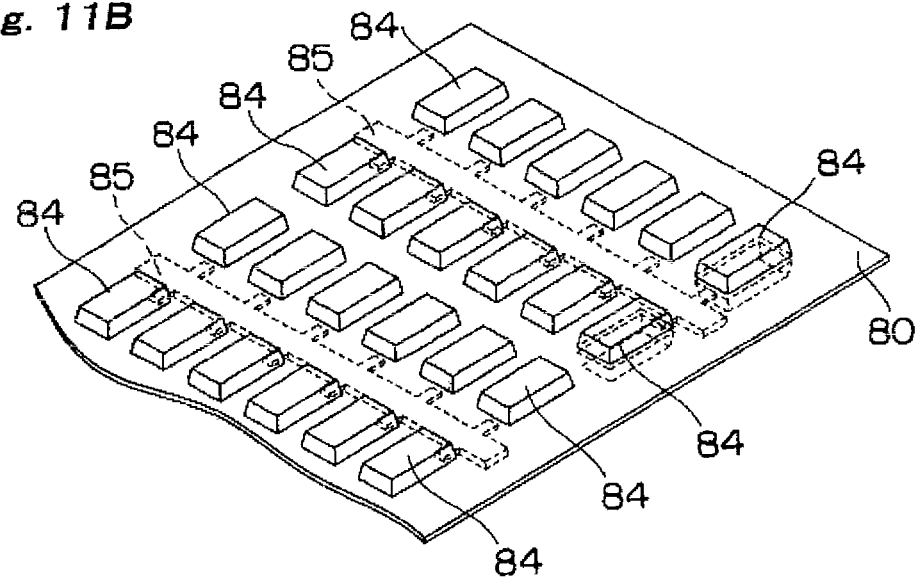
Figure 11C:
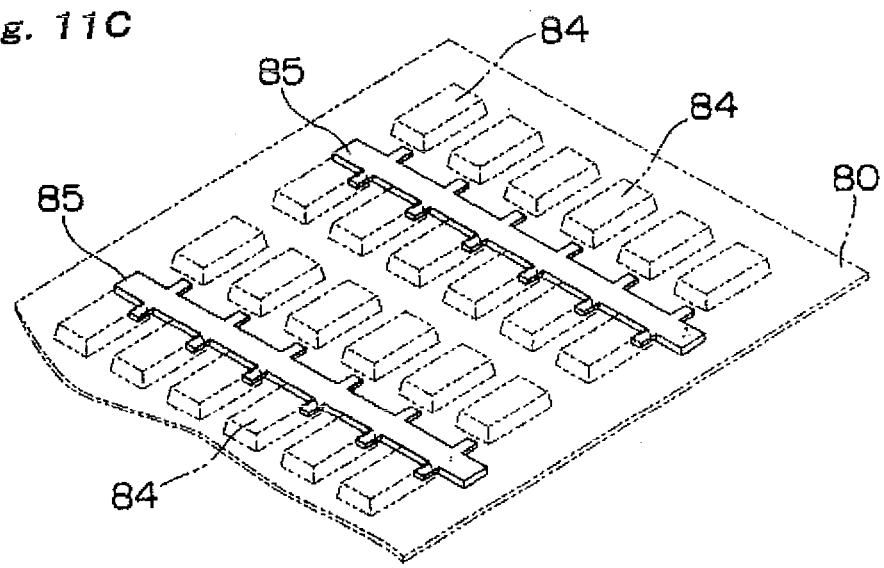

In addition, if a resin having a low melting temperature is used, it is possible to melt the resin without pressing it against the upper cavity bar. Thus, it is not necessarily required to provide the substrate board with thin grooves. Accordingly, as shown in FIG. 11, the substrate board 80 having no thin grooves may also be resin encapsulated. According to this embodiment, there is an advantage that the resin material can be more saved.

In the present embodiment, although the case where the plunger plates, the equi-pressure device and the like are disposed in the lower mold base, it is a matter of course that the plunger plates and the like may be disposed in the upper mold base.

INDUSTRIAL APPLICABILITY

The mold apparatus for resin encapsulation according to the present invention can be applied not only to a lead frame but also to a plastic substrate board, and furthermore, it can be applied not only to the resin encapsulation of one side of a plastic substrate board but also to the resin encapsulation of both sides thereof.

The invention claimed is:

1. A mold apparatus for resin encapsulation, wherein a peripheral edge portion of a substrate board, on which electronic components are mounted, is clamped by both an upper mold disposed in a lower surface of an upper mold set and a lower mold disposed in an upper surface of a lower mold set, wherein cavities are formed, a resin for encapsulation, which is inserted into pots provided in any one of the mold sets, is fluidified through plungers, and the melted resin is filled in the cavities, whereby the electronic components mounted on a surface of the substrate board are encapsulated with the resin, wherein a plurality of thin groove-shaped pots are provided in parallel at a predetermined pitch in a region, where the substrate board is disposed, of one of opposite surfaces of the lower mold and the upper mold, each thin groove-shaped pot is individually provided with a plurality of cavities in parallel through runners, a chase provided with plunger plates, which are inserted in advance into the thin groove-shaped pots so as to be able to move up and down, and the mold is slid sideways so as to be attachable to and detachable from the mold set, each plunger plate is driven by each plunger, the resin for encapsulation inserted into the pot is melted with the plunger plate, and the melted resin is filled in the cavities through the runners.

2. The mold apparatus for resin encapsulation according to claim 1, wherein the plunger plate has a T-shaped front face with its one end portion having a wide portion.

3. The mold apparatus for resin encapsulation according to claim 2, wherein a thin groove into which a melted resin can penetrate is provided along a width direction in at least one surface of the wide portion of the plunger plate.

4. The mold apparatus for resin encapsulation according to claim 1, wherein an engagement portion provided at one end portion of the plunger having a circular shape in cross section is engaged in a sliding manner with an engagement receiving portion provided at one end edge portion of the plunger plate.

5. The mold apparatus for resin encapsulation according to claim 1, wherein thin grooves, each of which has the same planar shape as that of an opening of the pot, are provided in positions, which correspond to the pots, of the substrate board to be positioned to the mold.

6. The mold apparatus for resin encapsulation according to claim 1, wherein a resin for encapsulation is a bar-shaped material having the same planar shape as that of an opening of the pot.

7. The mold apparatus for resin encapsulation according to claim 1, wherein a resin for encapsulation has a block shape, which is obtained by dividing a bar-shaped material having the same planar shape as that of an opening of the pot into a plurality of pieces.

* * * * *